US007016259B2

(12) United States Patent
Jakobs (10) Patent No.: US 7,016,259 B2
(45) Date of Patent: Mar. 21, 2006

(54) APPARATUS FOR CALIBRATING THE RELATIVE PHASE OF TWO RECEPTION SIGNALS OF A MEMORY CHIP

(75) Inventor: Andreas Jakobs, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/949,793

(22) Filed: Sep. 24, 2004

(65) Prior Publication Data

US 2005/0094462 A1    May 5, 2005

(30) Foreign Application Priority Data

Sep. 27, 2003 (DE) ................. 103 44 818

(51) Int. Cl.
*G11C 8/18* (2006.01)

(52) U.S. Cl. .................. 365/233; 365/51; 365/63; 327/146; 327/155

(58) Field of Classification Search ........... 365/51, 365/63, 233; 327/146, 155
See application file for complete search history.

(56) References Cited

U.S. PATENT DOCUMENTS

| 4,305,045 | A | * | 12/1981 | Metz et al. ............... 331/1 A |
| 5,218,486 | A | * | 6/1993 | Wilkinson ................. 360/27 |
| 5,513,377 | A | * | 4/1996 | Capowski et al. ........... 710/61 |
| 6,003,118 | A | | 12/1999 | Chen ........................ 711/167 |
| 6,029,250 | A | | 2/2000 | Keeth ....................... 713/400 |
| 6,323,705 | B1 | | 11/2001 | Shieh et al. ................ 327/158 |
| 6,937,534 | B1 | * | 8/2005 | Lim et al. .................. 365/222 |
| 2002/0105838 | A1 | | 8/2002 | Maruyama et al. ......... 365/194 |
| 2003/0117884 | A1 | | 6/2003 | Toda et al. ................. 365/233 |

FOREIGN PATENT DOCUMENTS

DE    197 13 660 A1    10/1998

OTHER PUBLICATIONS

German Patent Office Examination Reprt dated Jun. 11, 2004.

* cited by examiner

*Primary Examiner*—Andrew Q. Tran
(74) *Attorney, Agent, or Firm*—Patterson & Sheridan, L.L.P.

(57) ABSTRACT

A calibration apparatus is provided for adjusting the relative phase between two signals received at a memory chip, the two signals being generated such that they are synchronized with one another in a controller and are transmitted to the memory chip via separate lines. The calibration apparatus comprises a measuring device, which is arranged in the memory chip and is designed for measuring the relative phase between the two received signals, and a feedback loop containing a phase-controlling correction device. The measuring device is designed for generating an item of control information indicating the deviation of the measured relative phase from a defined tolerance range. The correction device responds to the control information to compensate for the deviation. The correction device is arranged in the controller and is designed for influencing the relative phase between the two signals to be transmitted to the memory chip. The feedback loop contains a signal connection leading from the memory chip to the controller.

20 Claims, 4 Drawing Sheets

APPARATUS FOR CALIBRATING THE RELATIVE PHASE OF TWO RECEPTION SIGNALS OF A MEMORY CHIP

CROSS-REFERENCE TO RELATED APPLICATIONS

This application claims foreign priority benefits under 35 U.S.C. §119 to co-pending German patent application number DE 103 44 818.7, filed 27 Sep. 2003. This related patent application is herein incorporated by reference in its entirety.

BACKGROUND OF THE INVENTION

1. Field of the Invention

The invention relates to an apparatus for calibrating the relative phase between two signals received at a memory chip.

2. Description of the Related Art

During operation, memory chips usually communicate with a controller that supplies and receives the data to be written to and read from the memory chip and also supplies the address information for selection of the memory cells at which the data are intended to be written and read, respectively. The controller furthermore generates and transmits to the memory chip a basic clock signal (system clock) as a time base for synchronizing the memory operation with the controller operation and also command signals for initiating the operating sequences respectively desired in the memory chip. The data, address and command signals are transferred as binary coded digital signals with a respectively assigned clock, the clock rate of the address and command signals usually corresponding to the basic clock while the clock rate of the data ("data rate") either likewise corresponds to the basic clock (single data rate operation) or amounts to a multiple of the basic clock rate (multiple data rate operation).

The data are sampled by the edges of a strobe signal with the data rate both at the transmission and at the reception end. At each end, the strobe signal used there should have a fixed phase angle with respect to the basic clock signal that appears there, and secondly, the sampling edges of the strobe signal should lie as far as possible centrally between the bit limits of the data to be sampled, but in any event within a specific tolerance range over the center of the bit limits in order to avoid a sampling too near to the bit limits. Said tolerance range should not be wider than half a period of the data rate (i.e., the time interval between the sampling edges), and the data bit center should not be greater than a quarter period of the data rate.

Typically, the controller and each memory chip that communicates with the controller are in each case formed as an integrated semiconductor circuit on separate chips and connected to one another via conductor tracks on a common circuit board. Since the basic clock signal and the data are transferred via separate line runs from the controller to the memory chip, propagation time differences may occur on account of differing lengths of the lines and/or on account of differing propagation speeds of the signals along the lines. The propagation speed may be dependent inter alia on the structure and other physical properties of the respective line and also on the temperature, which may fluctuate both temporally and spatially. Of course, said propagation time differences influence the relative phase between signals received at the memory chip via separate lines. Consequently, correctly timed sampling of the data received at the memory chip could be unsuccessful unless particular additional measures are taken for synchronizing the data sampling at the reception end with the data clock.

For this purpose, it is known and generally customary to generate, in the controller, a data clock signal in a fixed phase relationship with the strobe signal used there and to transmit the data clock signal together with the sampled data via a separate data clock line to the memory chip. The data clock line runs in the same line bundle as the data lines and has practically the same characteristics as the latter so that propagation time differences between the data clock signal and the data are very small. Consequently, the data clock signal received at the memory chip may be used as a time base for a reliable sampling of the received data.

At high data rates, however, even the very small propagation time differences between the data lines and the clock line may lead to sampling errors. In order to avoid this, DE 197 13 660 A1 discloses providing at the reception end for each of the data signals received in parallel, in each case, a delay device as a correction device for the phase adjustment of the data signal and in each case a phase comparator. Each phase comparator measures the actual value of the relative phase between the relevant data signal and the clock signal and in accordance with the measurement result, supplies an item of control information to the assigned delay device in order to correct deviations in the actual value from a prescribed tolerance range.

When a controller is combined with one or a plurality of memory chips, this known phase calibration requires a relatively complicated circuit arrangement in each memory chip. Therefore, there is a need for a calibration apparatus for the compensation of undesirable changes in the relative phase between different reception signals of a memory chip such that the requisite circuitry outlay in the memory chip is low.

SUMMARY OF THE INVENTION

The invention relates to an apparatus for calibrating the relative phase between two signals received at a memory chip, which signals are generated such that they are synchronized with one another in a controller and are transmitted via separate lines to the memory chip. A preferred, but not exclusive, area of application of the invention is RAM chips (random access memories), in particular SDRAMs (synchronous dynamic RAMs).

One aspect of the invention is to design a calibration apparatus for the compensation of undesirable changes in the relative phase between different reception signals of a memory chip such that the requisite circuitry outlay in the memory chip is low.

One embodiment of the invention is realized by a calibration apparatus for adjusting the relative phase between two signals received at a memory chip, which signals are generated such that they are synchronized with one another in a controller and are transmitted to the memory chip via separate lines, the calibration apparatus containing a measuring device, which is arranged in the memory chip and is designed for measuring the relative phase between the two received signals, and a feedback loop containing a phase-controlling correction device, the measuring device designed to generate an item of control information indicating the deviation of the measured relative phase from a defined tolerance range and the correction device configured to respond to the control information to compensate for the deviation. One embodiment of the invention is characterized by the fact that the correction device is arranged in the controller and is designed for influencing the relative phase between the two signals to be transmitted to the memory chip and that the feedback loop contains a feedback signal connection leading from the memory chip to the controller.

One embodiment of the invention affords the advantage that a technically complicated part of the compensation apparatus, namely the correction device for precise adjustment of the relative phase between two signals, is not integrated in the memory chip. This is because if suitable phase correction devices are to operate precisely, they require high-precision timing elements that meet particular requirements of the integration technology. For the production of controllers, however, a technology is employed which permits the formation of timing elements with higher precision than the technology that is usually employed for producing memory chips.

Many controllers are designed such that they can simultaneously communicate with two or more memory chips as partners. Such controllers have, for each of the partners that are to be simultaneously controlled, in each case a separate data interface, if appropriate also with a separate terminal for a data clock signal that is possibly used, while the address and command signals and also the basic clock signal are used jointly for all the partners. In such cases, a separate phase correction device may be provided for each partner. In an advantageous refinement of the invention, the feedback signal connections of all the partners are combined in a so-called wired-ORing at a single common terminal of the controller.

BRIEF DESCRIPTION OF THE DRAWINGS

The invention and advantageous refinements are explained in more detail below using exemplary embodiments with reference to the drawings as follows.

DETAILED DESCRIPTION OF THE PREFERRED EMBODIMENT

Figure 1:
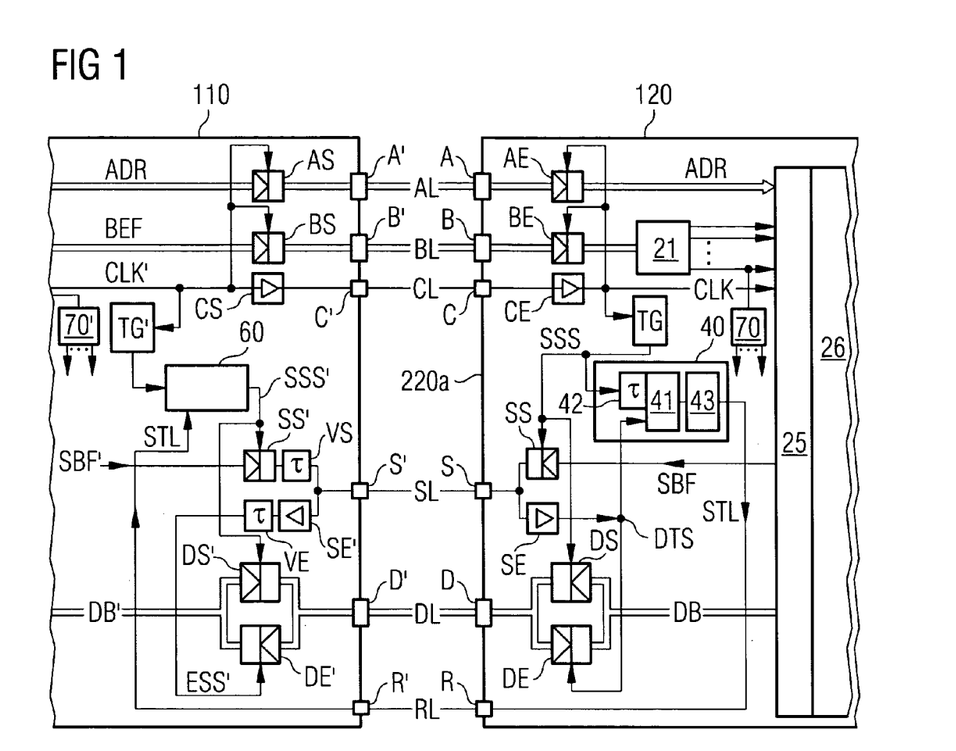
FIG. 1 schematically shows a first embodiment of a calibration apparatus for the synchronized data transfer from a controller to a memory chip.

FIG. 1 shows constituent parts of a controller chip (or controller) 110 on the left-hand side and constituent parts of a memory chip 120, an SDRAM in the example illustrated, on the right-hand side, next to the controller chip. The two chips, implemented as integrated circuits on separate chips, are designed for reciprocal communication via transfer lines that may have a differing propagation time for the reasons mentioned above.

The SDRAM 120 according to FIG. 1 has a plurality of signal terminals for communication with the controller 110, namely: a data terminal D with n pins (not individually illustrated) for receiving and transmitting data bursts having a bit width n via a bundle of n parallel data lines DL to and from a data terminal D' (of the same type) of the controller 110; a synchronizing signal terminal S for receiving and transmitting a data clock signal that specifies the data clock via a data clock line SL to and from a synchronizing signal terminal S' (of the same type) of the controller 110; an address input A with a plurality of pins for receiving an item of address information comprising a plurality of parallel bits via a bundle of address lines AL from an address output A' of the controller 110; a command input B with a plurality of pins for receiving multi-bit command words via a bundle of command lines BL from a command output B' of the controller 110; a clock input C for receiving a basic clock signal CLK (clock signal) via a basic clock line CL from a clock output C' of the controller 110.

To synchronize the signals transferred between the controller 110 and the SDRAM 120, transmission sampling circuits and reception sampling circuits are utilized at the respective terminals. Each of these sampling circuits is designed such that when a clock edge appears at its sampling control terminal (strobe terminal), it takes up the binary value of the signal present at the input and makes it available ("latches it") at the output until the next clock edge, at which the subsequently present binary value is "latched" in the same way.

Throughout the memory operation, the basic clock signal CLK' generated in the controller 110 is transmitted via a transmission amplifier CS and the basic clock line CL to the SDRAM 120, where it is amplified in a reception amplifier CE. The command bits and the address bits are synchronized with the transmitted basic clock signal CLK' in the controller 110 by means of a command transmission sampling circuit BS and an address bit transmission sampling circuit AS, respectively, and the command bits and the address bits are resynchronized in the SDRAM 120 with the basic clock signal CLK received there by means of a command reception sampling circuit BE and an address bit reception sampling circuit AE, respectively, to correct possible propagation time differences between the lines CL, BL and AL.

A command decoder 21 contained in the SDRAM 120 decodes the command bits with synchronization by the received basic clock signal CLK to stimulate individual command lines for execution of the respective commands, inter alia for execution of the activation command for initiating access to the memory cells of the SDRAM, command lines for execution of the write command and the read command, and a command line for execution of an initialization command at the beginning of the memory operation.

In FIG. 1, the memory cells of the SDRAM 120 are illustrated schematically as a block 26, and the access control device 25 for write and read access to the memory cells is also illustrated schematically. The access control device 25 receives the basic clock signal CLK and the signals of the output-side command lines of the command decoder 21. The access control device 25 may contain address decoders and a switchable network of data paths to control the writing and reading of data at the memory cells as generally known. Further constituent parts of the SDRAM 120 and also of the controller 110 which interact during the data transfer between the two chips are described below in connection with the write operation and the read operation.

During operation, transmission strobe signals SSS' and SSS are respectively generated in the two chips 110 and 120 by means of respective clock generators TG' and TG. The transmission strobe signals are synchronized with CLK and the sampling clock edges of which signals appear with a repetition frequency corresponding to the data rate. The repetition frequency may be equal to the frequency of the basic clock signal CLK (for single data rate operation) or a multiple thereof (for operation with a multiplied data rate).

Write Operation:

The data to be written are called up with the data rate within the controller 110, e.g., at the data buffer of the controller (not shown). The data burst that has been called up passes via the data bus DB' of the controller to the data input of a data transmission sampling circuit DS', which samples the data by means of the transmission strobe signal SSS'. The sampled write data DAT' are transmitted via the data lines DL to the data terminal D of the SDRAM 120.

In the case of the example shown, an accompanying data clock signal that is to be transmitted to the SDRAM 120 from the synchronizing signal terminal S of the controller 110 is generated in such a way that its edges fall about the center between the bit limits of the transmitted data. For this purpose, a separate transmission sampling circuit SS' is used, which receives a "simulated" bit sequence SBF', which is generated in the controller 110 synchronously with the called-up data and in which the two binary levels may alternate between "0" and "1" from bit to bit. This bit sequence is sampled in the transmission sampling circuit SS' by means of the strobe signal SSS', in exactly the same way as the data in the transmission sampling circuit DS', and is subsequently delayed in a delay element VS connected downstream by a time quantity τ equal to half the period of the data rate. The data clock signal thus obtained is transmitted from the terminal S' via the data clock line SL to the synchronizing signal terminal S of the SDRAM 120.

In the SDRAM 120, the data burst received at the data terminal D passes to the input of a data reception sampling circuit DE, where it is sampled by means of the data clock signal DTS received from the synchronizing signal terminal S via a reception amplifier SE. Due to the delay τ of the data clock signal DTS introduced in the controller, its edges may fall relatively precisely in the center between the bit limits of the data received at the SDRAM 120. The reception data sampled in the data reception sampling circuit DE are passed via the data bus DB into the access control device 25, from where they are written to the memory cells selected by the address bits ADR.

Read Operation:

The data read from the memory cells selected by the address bits ADR in read operation are called up with the data rate at a data buffer (not shown) in the access control device 25 of the SDRAM 120. The data burst that has been called up passes via the data bus DB to the data input of a data transmission sampling circuit DS, which samples the read data burst by means of the transmission strobe signal SSS. The sampled read data are transmitted via the data lines DL to the data terminal D' of the controller 110.

In the case of the example shown, an accompanying data clock signal that is likewise to be transmitted to the controller 110 is generated in such a way that its edges coincide exactly (or about the same) with the bit limits of the transmitted data. For this purpose, a separate transmission sampling circuit SS is also used in the SDRAM 120, which circuit receives a simulated bit sequence SBF, which is generated synchronously with the called-up read data and in which the two binary levels may alternate between "0" and "1" from bit to bit. The data clock signal thus obtained is transmitted via the data clock line SL to the synchronizing signal terminal S' of the controller 110.

In the controller 110, the read data burst received at the data terminal D' passes to the input of a data reception sampling circuit DE', where it is sampled by means of a reception strobe signal ESS'. The signal ESS' is derived from the data clock signal received at the terminal S', to be precise via a reception amplifier SE' and a delay element VE connected downstream, which brings about a delay by the time quantity τ (i.e., a delay by half a period of the data rate). Consequently, the sampling edges of ESS' fall relatively precisely in the center between the bit limits of the read data received at the controller. The read data sampled in the data reception sampling circuit DE' of the controller 110 are forwarded via the data bus DB' for further processing.

The details of the controller 110 and of the SDRAM 120 that have been described up to this point are generally known. However, FIG. 1 furthermore shows the installation of a novel apparatus for phase calibration in accordance with embodiments of the present invention. The construction and the operation of this apparatus are described in detail below.

Phase Calibration

In the exemplary embodiment according to FIG. 1, the phase calibration apparatus is designed for holding the relative phase between data clock signal DTS received at the SDRAM 120 and the basic clock signal CLK received at the SDRAM 120 within a prescribed tolerance range. This is particularly expedient because the risk of unpredictable propagation time differences between the basic clock line CL and the data clock line SL may be particularly high, in particular due to the usually differing length and the usually differing spatial course of the lines. Since the command and address processing in the SDRAM and also the processes when writing and reading at the memory cells are controlled by the basic clock CLK, a fixed (or as fixed as possible) phase relationship between the data clock DTS and the basic clock CLK is important precisely in the memory chip.

As shown in FIG. 1, a measuring device 40 is provided in the SDRAM 120. The task of the measuring device is to derive an item of information which is informative about the actual relative phase between CLK and DTS. In the case illustrated, the ideal state would be for the phase of the data clock signal DTS to lag with respect to the phase of the basic clock signal CLK by the time quantity τ (i.e., by half a period of the data rate). The desired value of the relative phase of the data clock signal DTS with respect to the basic clock signal CLK is thus equal to −τ.

A phase comparison between two signals containing periodically successive edges is produced most simply by comparison of the temporal occurrence of mutually corresponding edges. However, the frequency of the data clock signal DTS may be either equal to or a multiple of the frequency of the basic clock CLK, depending on whether the system operates with single or multiple data rate. Therefore, it is advantageous, for the time comparison of the edges, not to use the basic clock signal CLK directly, but rather to use a signal derived from CLK. In one embodiment, the signal derived from CLK is phase-locked with CLK and has the same frequency as the data clock signal DTS. This precondition is satisfied by the strobe signal SSS in the case of the SDRAM 120 illustrated in FIG. 1. The strobe signal is generated by the clock generator TG with synchronization by the basic clock CLK and is normally used in read operation for sampling the data transmitted by the SDRAM, as described above.

The relative phase between CLK and DTS in the SDRAM 120 is thus reflected in the relative phase between the signals SSS and DTS of identical frequency. The relative phase between CLK and DTS correctly has the desired value if DTS lags with respect to SSS by the time quantity τ (i.e., by half a period of the data rate). To check this, in the measuring device 40, the signal SSS is delayed by the time quantity τ by means of the timing element 42, and the temporal position of the edges of this delayed signal with respect to the corresponding edges of the signal DTS is sensed in a phase comparator 41. In the event of coincidence of the edges, the relative phase of DTS with respect to CLK correctly has the desired value −τ. The comparison result at the output of the phase comparator 41 indicates the extent to which this value is complied with. Deviations from the desired value are to be permissible only within a specific tolerance range. A formatter 43 in the measuring device 40 formats from the comparison result an item of control information STL in a desired format for correcting the deviation.

Undesirable deviations of the relative phase between CLK and DTS from the desired value are corrected by means of a feedback loop with a correction device 60, which can influence the relative phase depending on the control information STL. According to one embodiment of the invention, the correction device 60 is arranged in the controller 110. In the example according to FIG. 1, the correction device 60 is a variable delay device connected downstream of the clock generator TG' in the controller configured to adjust the phase of the transmission strobe signal SSS' generated therefrom. Each phase change of SSS' influences the phase of the data clock signal DTS, received in the SDRAM 120, in a directly proportional manner in the same sense. The delay device 60 may be configured such that the center of the control range of the delay time Δ is $\Delta_0=k \cdot T$, where k is a natural number >0 and T is the reciprocal of the data rate (i.e., equal to the period of the data clock frequency). A setting $\Delta=\Delta_0$ is thus equivalent to a phase shift of zero, a setting $\Delta>\Delta_0$ provides a positive delay, and a setting $\Delta<\Delta_0$ provides a negative delay.

The setting of the delay time Δ in the correction device 60 may be effected by means of the control information STL using a feedback signal connection leading from the SDRAM 120 to the controller 110. In the exemplary embodiment shown in FIG. 1, said feedback signal connection is an additional single-core line RL leading from an additional terminal R of the SDRAM 120 to an additional terminal R' of the controller. The concrete design of the measuring device 40 and of the correction device 60 depends on the format in which the control information STL is to be transferred. Various configurations are possible in this case, as described below:

In a first configuration, the measuring device 40 is configured to format the control information STL as a binary signal (1-bit signal). The binary value ("0" or "1") of the binary signal indicates whether the phase difference between the compared signals lies within or outside the tolerance range. In this case, the correction device 60 is designed such that, if the binary value indicates that the phase difference is outside the tolerance range, the correction device runs through the control range of the delay Δ until the binary value changes.

In an alternative configuration, the measuring device 40 configured to supply the control information STL as a binary coded multibit signal in the serial and preferably self-clock-generating format, e.g., in the binary number code with sign bit which indicates magnitude and direction of the control deviation. In this case, the correction device 60 is configured to set the delay time Δ to a value that minimizes the control deviation, i.e., brings the relative phase between the signals CLK and DTS received in the SDRAM 120 to the desired value.

In the case of the calibration apparatus shown in FIG. 1, the feedback loop leads via an additional line RL between the SDRAM 120 and the controller, and the calibrating control circuit may be activated during the write operation. However, it may be preferable to activate the control circuit only outside the write and read cycles, preferably during an initialization interval each time before the SDRAM is switched on. The calibration process may be effected automatically as a response to the decoding of the initialization command in the command decoder 21. A control line activated in this case at the output of the decoder 21 may activate a calibration switch-on apparatus 70 provided in the SDRAM 120 to generate switch-on signals for the activation of that part of the calibration control circuit described which is contained in the SDRAM. In a similar manner, a switch-on apparatus 70' may be provided in the controller 110 to generate switch-on signals for the activation of that part of the control circuit which is contained in the controller. The relevant connections from the switch-on apparatuses 70 and 70' to elements of the control circuit are not depicted for reasons of clarity.

Figure 2:
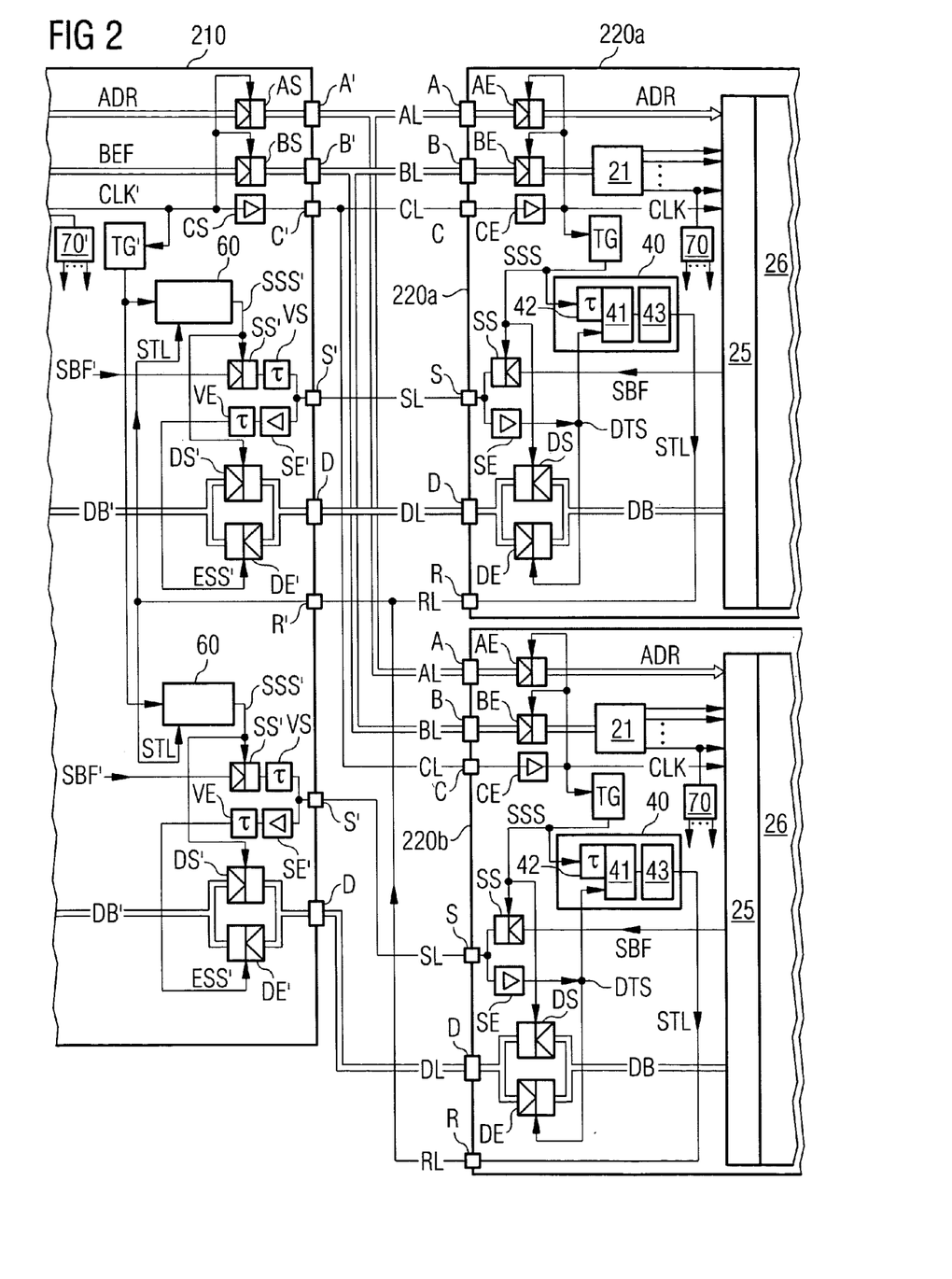
FIG. 2 illustrates the use of calibration apparatuses of the embodiment according to FIG. 1 for the synchronized data transfer from a controller to simultaneously two memory chips.

FIG. 2 shows the combination of a controller 210 with two SDRAMs 220a and 220b, each of which has the same construction as the SDRAM 120 according to FIG. 1. The controller 210 is designed for simultaneous operational control of the two SDRAMs. For communication with the first SDRAM 220a, the controller 210 contains the same elements as the controller 110 according to FIG. 1. For communication with the second SDRAM 220b, the "data interface" of the controller, i.e., the device for transmitting and receiving data and data clock signals, is provided additionally. Communication with the two DRAMs is effected in parallel using the same addresses ADR and commands BEF and the same basic clock signal CLK on the part of the controller. The transferred data are typically not the same, of course. Such an arrangement may be utilized to double the volume of data transferred per unit time between a controller and a memory module (i.e., the effective bit width of the memory data flow), without increasing the data rate (data clock frequency). To further increase the volume of data, more than two SDRAMs may be provided to communicate with a single controller in parallel in the manner shown, for which purpose the controller requires a corresponding plurality of separate data interfaces.

According to one embodiment of the invention, each of the (two or more) data interfaces of the controller contains its own correction device 60 for the phase calibration of the signals CLK and DTS of the respectively assigned SDRAM 220a and 220b. Consequently, a dedicated, independent phase calibration control circuit is implemented for each SDRAM. This is advantageous because the connecting lines between the controller and the various SDRAMS may have considerable length differences. Specifically, compensating for these length differences, e.g., by meandering routing of selected lines, is possible only with a relatively inaccurate result.

The feedback signal connections from all the SDRAMs to the respective data interfaces of the controller may pass via the same feedback terminal R', as shown in FIG. 2, for the case of two DRAMs 220a and 220b. This has the advantage that the number of external terminals of the controller remains limited. However, in this case, the calibration for the various DRAMs cannot be effected simultaneously, but rather is effected in temporally staggered fashion or in time division multiplex. In this case, the measuring devices 40 in the DRAMs must be designed such that they always supply the logic value "0" to the relevant feedback terminal R if they do not receive a data clock signal DTS. Furthermore, the output impedances of the measuring devices 40 must be dimensioned such that a so-called "wired ORing" results at the combination of the feedback lines RL from the various SDRAMs.

The temporally staggered calibration in the arrangement according to FIG. 2 may be effected by temporally controlled activation of the calibration switch-on apparatuses 70 and 70'. The activation of the switch-on apparatus 70' contained in the controller has the effect that only one of the correction devices 60 and only the assigned strobe signal transmission sampling circuit SS' are switched on. Consequently, only the measuring device 40 of the assigned SDRAM receives a data clock signal DTS and supplies an item of control information STL to the feedback terminal R of the relevant SDRAM. On account of the above-mentioned wired-ORing, each logic "1" in this control information drives the feedback terminal D' of the controller 210 to "1", i.e., overwrites the "0" coming from the other SDRAM (or that from all the other DRAMs).

If a simultaneous calibration at all the SDRAMs is desired, it may be necessary to provide a dedicated feedback terminal R' at the controller for each SDRAM.

Embodiments of the invention may also be realized without having to provide any separate feedback terminals R and R' respectively at the controller and memory chips and without requiring a separate line system for the feedback between the chips. This is possible if one or a plurality of the data lines DL present is or are used for the feedback signal connection. A corresponding embodiment is shown in FIG. 3, as an example of the combination of a controller 310 with a single SDRAM 320.

Figure 3:
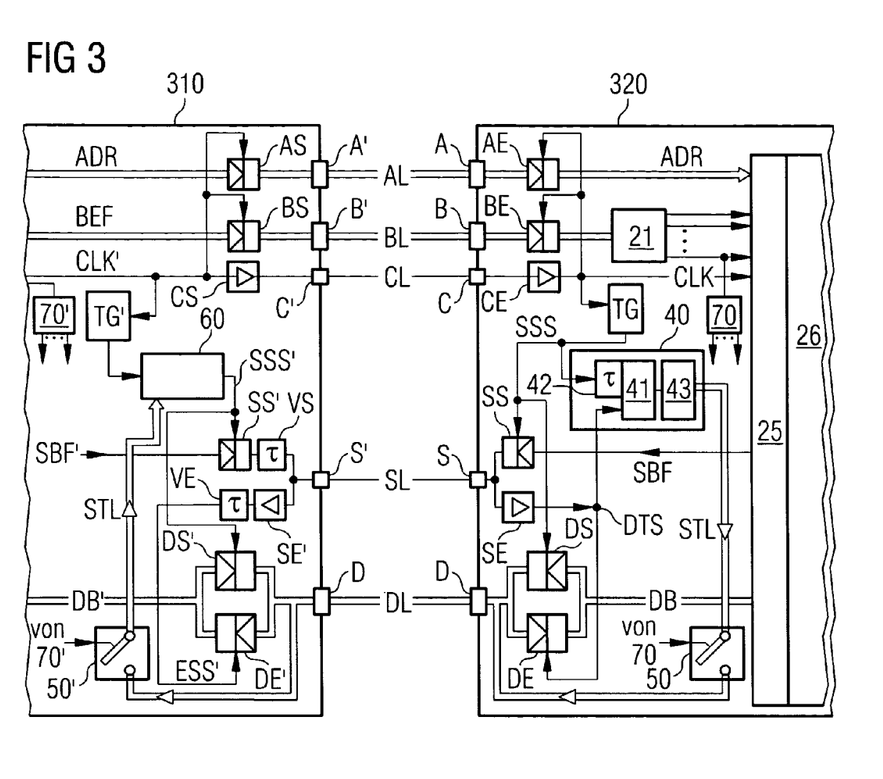
FIG. 3 shows a second embodiment of a calibration apparatus.

The controller 310 and the SDRAM 320 shown in FIG. 3 correspond in almost all parts to the chips 110 and 120 according to FIG. 1. Identical or corresponding elements and signals are designated by the same reference symbols in FIG. 3 as in FIG. 1 and also act in a similar manner, so that reference may be made to the description of FIG. 1. Consequently, it suffices to explain below only the differences with respect to the embodiment according to FIG. 1.

In accordance with FIG. 3, the output of the measuring device 40 in the SDRAM 320 is connected via a switch 50 to the data port D of the DRAM, and the input of the correction device 60 in the controller 310 is connected via a switch 50' to the data port D' of the controller. In normal operation of the SDRAM, i.e., during the write and read cycles, the switches 50 and 50' are in the open state shown, so that the calibration control circuit does not operate, and the write and read data can be transferred undisturbed between the chips 310 and 320, in accordance with the write and read operation described above. The correction device 60 is held unchanged in its state that was set last/previously, i.e., the delay time Δ is latched to the value that was set last/previously. The measuring device 40 may be switched off.

In calibration operation, which is activated by the calibration switch-on apparatuses 70 and 70', preferably during the initialization interval, the switches 50 and 50' are closed so that the feedback loop from the measuring device 40 to the correction device 60 via the data lines DL is closed. The transmission and reception sampling circuits DS, DS', DE, DE' for the data may be switched into an inactive state during the calibration operation so that the data line DL is decoupled from the data buses DB and DB'. The latching of the correction device 60 is cancelled and the transmission sampling circuit SS' for the data clock signal and also the simulated bit sequence SBF' in the controller are activated, as are the receiver SE and the measuring device 40 in the SDRAM 320. The basic clock signal CLK and the clock generators TG and TG' are active, as during normal operation. All these switching states are set by output signals of the switch-on apparatus 70 and 70' in response to a calibration command.

In a similar manner to that in the case of the calibration apparatus according to FIG. 1, in the case of the apparatus according to FIG. 3, various configurations are possible with regard to the design of the measuring device 40 and the correction device 60, as described below.

In a first configuration, the measuring device 40 is configured to supply the control information STL as a binary coded multibit signal in the parallel format, preferably as an n-bit signal in the binary number code with a sign bit to indicate the magnitude and the direction of the control deviation. In this case, the correction device 60 is configured to set the delay time A to a value that minimizes the control deviation, i.e., brings the relative phase between the signals CLK and DTS received in the SDRAM 120 to the desired value. This configuration has the advantages that the transfer time is particularly short and that the resolution is particularly high. On the other hand, the connecting lines from the measuring device 40 to the data terminal D of the SDRAM and from the data terminal D' of the controller to the correction device 60 in each case have to be designed as a multi-core bus, and the switches 50 and 50' also have to have a corresponding plurality of poles. Furthermore, the same unambiguous assignment of the terminal pins to the bits of the control information STL has to be ensured at both data terminals D and D'. The unambiguous assignment can be avoided if the control information STL is synchronously transferred serially via all the data lines, but such serial transfer prolongs the transfer time.

In a second configuration, the measuring device 40 is configured to format the control information STL as an n-bit signal in the so-called thermometer code in which the information is represented by the number of bits of a specific binary value, e.g., by the number of bits with the binary value "1". The coding in the formatter 43 of the measuring device 40 may provide that a zero control deviation is expressed by an average number of "1" bits, while a positive or negative control deviation is expressed by a correspondingly higher or lower number of "1" bits, respectively. The correction device 60 includes a corresponding decoder. Although such a thermometer code has a far lower resolution than a binary number code, an unambiguous assignment of the terminal pins to the bits of the control information STL becomes advantageously unnecessary.

In a third configuration, the measuring device 40 is configured to generate the control information STL as a binary signal (1-bit signal), the binary value ("0" or "1") of which indicates whether the phase difference between the compared signals lies within or outside the tolerance range. In this case, the bit comprising the control information STL may be transferred to the correction device 60 in parallel via all the data lines. In this case, the correction device 60 is designed such that if the binary value indicates that the phase difference is outside the tolerance range, the control device varies the delay through the control range of the delay Δ until the binary value changes. This configuration likewise has the advantage that it is not necessary to ensure an unambiguous assignment of the terminal pins to bits of the control information STL. However, this configuration may require relatively long calibration duration.

The first and third configurations may also be modified to the effect that only a single selected data line of the data line bundle DL is used for the transfer from the SDRAM 320 to the controller 310. This has the advantages that the connecting lines from the measuring device to the data terminal D of the SDRAM and from the data terminal D' of the controller to the correction device may in each case have a single core and that the switches 50 and 50' need only have one pole, which reduces the circuitry outlay and the space requirement on the chips. However, an unambiguous assignment of terminal pins is necessary at the data terminals D and D'. In the case of the binary number coding of the control information STL described, the single-core transfer has to be effected serially, of course, which lengthens the transfer time.

Figure 4:
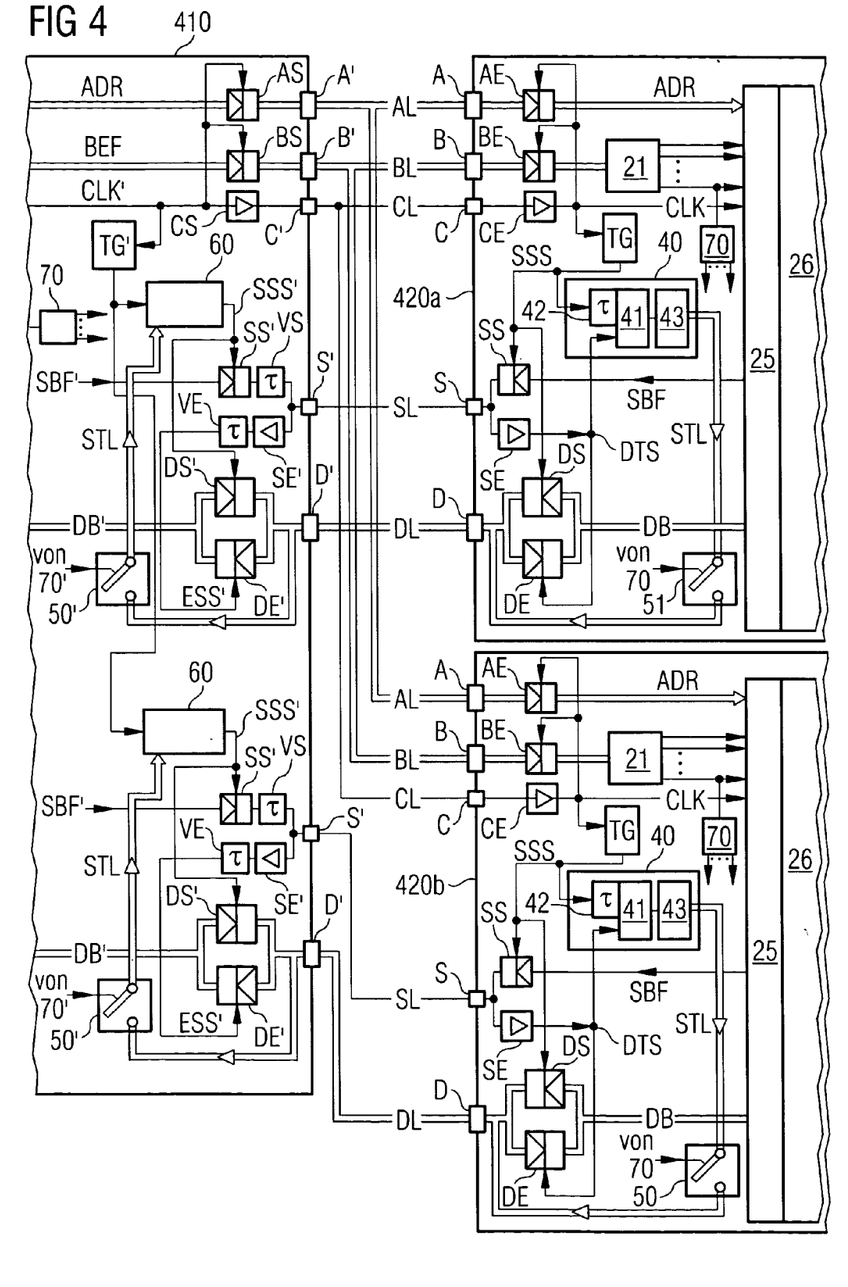
FIG. 4 illustrates the use of calibration apparatuses of the embodiment according to FIG. 2 for the synchronized data transfer from a controller to simultaneously two memory chips.

If a controller chip contains more than one data interface to communicate with a plurality of memory chips in parallel, the calibration apparatus as shown in FIG. 3 may be utilized in a corresponding plurality, respectively one for each pair of a data interface and a memory chip, in a similar manner to that in the case of the embodiment according to FIG. 2. A corresponding arrangement is shown in FIG. 4, for the example of a controller 410 that communicates with two SDRAMs 420a and 420b, each of which is configured similarly as the SDRAM 320 according to FIG. 3. Each of the two data interfaces of the controller 410 corresponds to the data interface of the controller 310 according to FIG. 3, including the correction device 60 and the control signal lead with the switch 50'. The connection scheme between the chips is similar to that shown in FIG. 2, except that no separate feedback terminals R and R' are provided at the chips and, accordingly, the relevant connecting lines are also absent. The calibration operation may proceed simultaneously for all the SDRAMs 420a and 420b, outside the write and read cycles, preferably in the initialization interval.

The invention is not restricted to the embodiments described above with reference to FIGS. 1 to 4, which are only examples. Further variants are possible within the scope of the invention. Some of these are mentioned briefly below.

The correction device 60 may also be arranged to alter the phase of the basic clock signal CLK transmitted by the controller instead of the phase of the transmission strobe signal SSS' generated in the controller.

The calibration apparatus according to one embodiment of the invention may also be used to calibrate the relative phase between two signals other than the basic clock signal and the data clock signal. The two signals may be, e.g., the basic clock signal and one of the data signals transmitted in parallel, or respectively two different signals from the parallel data signals, or respectively one of the data signals and the accompanying data clock signal. In such cases, the feedback signal connection between memory chip and controller may be routed via a separate feedback line.

While the foregoing is directed to embodiments of the present invention, other and further embodiments of the invention may be devised without departing from the basic scope thereof, and the scope thereof is determined by the claims that follow.

What is claimed is:

1. A calibration apparatus for adjusting a relative phase between a first signal and a second signal received at a memory chip, the calibration apparatus comprising:

a measuring device, arranged in the memory chip, configured to measure the relative phase between the received first and second signals and generate an item of control information indicating a deviation of the measured relative phase from a defined tolerance range, wherein the first and second signals are generated and synchronized in a controller and are transmitted to the memory chip via separate lines; and a phase-controlling correction device, arranged in the controller and disposed in a feedback loop having a feedback signal connection leading from the memory chip to the controller, the phase-controlling correction device configured to compensate for the deviation in response to the control information, by influencing the relative phase between the first and second signals being transmitted to the memory chip.

2. The calibration apparatus of claim 1, wherein the feedback signal connection is a single-core feedback line.

3. The calibration apparatus of claim 2, wherein the single-core feedback line is a separate line arranged additionally to a plurality of lines required for memory operations between the controller and the memory chip.

4. The calibration apparatus of claim 1, wherein at least one data line of a plurality of parallel data lines provided for transferring memory data between the controller and the memory chip is selected as the feedback signal connection, and wherein at least one switching means is provided in each of the controller and the memory chip corresponding respectively to the selected at least one data line, the switching means arranged to selectively close the feedback loop via the selected at least one data line in response to a calibration command.

5. The calibration apparatus of claim 4, wherein only one of the plurality of parallel data lines is selected as the feedback signal connection.

6. The calibration apparatus of claim 1, wherein the measuring device is configured to generate the item of control information as binary information indicating whether the measured relative phase lies within the tolerance range, and wherein the phase-controlling correction device is configured to progressively alter the relative phase between the first and second signals being transmitted to the memory chip until the control information transferred via the feedback connection indicates that the measured relative phase in the memory chip lies within the tolerance range.

7. The calibration apparatus of claim 6, wherein the measuring device is configured to transmit the binary control information simultaneously via all the data lines to the controller.

8. The calibration apparatus of claim 1, wherein the measuring device is configured to generate the control information as a digital multibit signal.

9. The calibration apparatus of claim 8, wherein the multibit signal is coded in binary number code.

10. The calibration apparatus of claim 9, further comprising transfer means for serially transferring binary number code bits via the feedback signal connection.

11. The calibration apparatus of claim 9, further comprising transfer means for transferring binary number code bits in parallel format via a number of parallel data lines corresponding to a number of bits.

12. The calibration apparatus of claim 8, wherein the multibit signal is coded in an n-bit thermometer code in which the information is represented by the number of bits of a specific binary value, and wherein transfer means are provided for transferring the bits of said thermometer code in parallel format via n data lines.

13. The calibration apparatus of claim 1, wherein at least one of the first and second signals is generated by the controller in a phase-locked manner with a sampling signal for determining a clock for transmitted memory data.

14. The calibration apparatus of claim 1, wherein the first and second signals are a basic clock signal and a data clock signal, and wherein the data clock signal is generated by the controller in a phase-locked manner with a sampling signal for determining a clock for transmitted memory data and is transmitted via a data clock line to the memory chip.

15. The calibration apparatus of claim 1, further comprising:
   a calibration switch-on means for activating the calibration apparatus during an initialization interval in response to a calibration command.

16. The calibration apparatus of claim 15, wherein the controller includes generating means for generating the calibration command in the initialization interval after the memory chip has been switched-on.

17. A memory system, comprising:
   a plurality of memory chips;
   a controller disposed in connection with the plurality of memory chips, the controller having a plurality of data interfaces, each data interface configured for communication with a respective data interface of a respective memory chip; and
   a plurality of calibration apparatuses, wherein each data interface pair is provided a respective calibration apparatus, each calibration apparatus configured to adjust a relative phase between a first signal and a second signal received at the respective memory chip, wherein the first and second signals are generated and synchronized in the controller and are transmitted to the respective memory chip via separate lines, wherein at least one of the first and second signals is communicated via the respective data interface pair, each calibration apparatus comprising:
      a measuring device, arranged in the respective memory chip, configured to measure the relative phase between the received first and second signals and generate an item of control information indicating a deviation of the measured relative phase from a defined tolerance range; and
      a phase-controlling correction device, arranged in the controller and disposed in a feedback loop having a feedback signal connection leading from the memory chip to the controller, the phase-controlling correction device configured to compensate for the deviation in response to the control information, by influencing the relative phase between the first and second signals being transmitted to the memory chip.

18. The memory system of claim 17, wherein the feedback signal connections of the calibration apparatuses are combined in a wired-ORing at a common feedback terminal of the controller, and further comprising:
   a calibration switch-on apparatus for selectively activating the calibration apparatuses during different intervals.

19. A method for adjusting a relative phase between a first signal and a second signal received at a memory chip, comprising:
   measuring the relative phase between the received first and second signals utilizing a measuring device arranged in the memory chip, wherein the first and second signals are generated and synchronized in a controller and are transmitted to the memory chip via separate lines;
   generating an item of control information, utilizing the measuring device, the item of control information indicating a deviation of the measured relative phase from a defined tolerance range; and
   compensating for the deviation in response to the control information, by influencing the relative phase between the first and second signals being transmitted to the memory chip utilizing a phase-controlling correction device arranged in the controller and disposed in a feedback loop having a feedback signal connection leading from the memory chip to the controller, wherein the control information is communicated through the feed back loop.

20. The method of claim 19, further comprising:
   selecting at least one data line of a plurality of parallel data lines provided for transferring memory data between the controller and the memory chip as the feedback signal connection; and
   selectively close the feedback loop in response to a calibration command utilizing switching means provided in each of the controller and the memory chip corresponding respectively to the selected at least one data line.

* * * * *